(12) United States Patent
Reichinger

(10) Patent No.: US 6,481,101 B2
(45) Date of Patent: Nov. 19, 2002

(54) MANUFACTURE OF A WIRING LOOM

(75) Inventor: Gerhard Reichinger, Rednitzhembach (DE)

(73) Assignee: Leoni Bordnetz-Systeme GmbH & Co. KG (DE)

( * ) Notice: Subject to any disclaimer, the term of this patent is extended or adjusted under 35 U.S.C. 154(b) by 0 days.

(21) Appl. No.: 09/367,271

(22) PCT Filed: Feb. 13, 1998

(86) PCT No.: PCT/EP98/00831

§ 371 (c)(1),
(2), (4) Date: Aug. 13, 1999

(87) PCT Pub. No.: WO98/35856

PCT Pub. Date: Aug. 20, 1998

(65) Prior Publication Data

US 2002/0026709 A1 Mar. 7, 2002

(30) Foreign Application Priority Data

Feb. 13, 1997 (DE) .......................................... 197 05 439

(51) Int. Cl.[7] .............................................. H01R 43/00
(52) U.S. Cl. ............................. 29/868; 29/850; 29/755; 156/289; 174/72 A; 174/117 F
(58) Field of Search .......................... 29/868, 869, 755, 29/850; 174/72 A, 117 F, 117 FF, 84 R; 156/87, 289, 286; 524/310, 507, 572, 123, 124

(56) References Cited

U.S. PATENT DOCUMENTS

| | | | | |
|---|---|---|---|---|
| 4,210,773 A | * | 7/1980 | Haley et al. | 174/72 A |
| 4,217,157 A | * | 8/1980 | Stoltze et al. | 156/289 |
| 4,326,096 A | * | 4/1982 | Leitmann | 174/84 R |
| 5,247,000 A | * | 9/1993 | Allan | 524/310 |
| 5,250,758 A | * | 10/1993 | Fjelstad et al. | 174/72 A |
| 5,309,634 A | | 5/1994 | Van Order et al. | |
| 5,688,135 A | * | 11/1997 | Gallagher, Sr. | 174/72 A |
| 6,038,764 A | * | 3/2000 | Yamaguchi et al. | 29/854 |

FOREIGN PATENT DOCUMENTS

| | | | |
|---|---|---|---|
| DE | 23 33 170 | | 1/1975 |
| EP | 0 590 694 | | 4/1994 |
| FR | 2 371 858 | | 6/1978 |
| FR | 2 569 146 | | 2/1986 |
| JP | 5-207628 | * | 8/1993 |

* cited by examiner

Primary Examiner—Rick Kiltae Chang
(74) Attorney, Agent, or Firm—Venable; Robert Kinberg

(57) ABSTRACT

A method for producing a cable harness includes the step of applying an essentially strip-shaped base layer having a plastic thixotropic material to an assembly support. A plurality of essentially parallel adjacent wires are fixed to the base layer. A cover layer of plastic material is applied onto the base layer. The cover layer is subsequently treated so that the plastic material envelops the wires, adheres to the base layer and changes to a more solid consistency.

15 Claims, 4 Drawing Sheets

MANUFACTURE OF A WIRING LOOM

BACKGROUND OF THE INVENTION

So-called wiring boards are used in a conventional method of producing a cable harness, particularly for motor vehicles. The later course of the cable harness on a wiring board is predetermined. The individual wires are successively secured to the wiring board with the aid of mechanical fixing elements.

A cable harness is typically equipped with connecting elements, such as plugs or bushings. The individual wires are usually wound with the aid of adhesive tape for ensuring that the individual wires will remain bundled. In many cases, this type of fixing or jacketing is inadequate. In these instances, the cable harness is inserted into an injection mold and cast or foamed with a plastic material.

Clearly, this type of manufacturing method is very labor- and cost-intensive. Therefore, different alternative manufacturing methods have been proposed; these have been used especially for smaller cable harnesses or flat cable harnesses. For example, DE 27 58 491 discloses a method of producing a flat cable harness, in which a film is produced from a granulated, thermoplastic hot-melt plastic adhesive. In an insertion apparatus, the individual wires of a flat cable harness are positioned parallel to one another, and the hot-melt adhesive film is laid over the lines. Due to a slight pressure in a heating apparatus, the hot-melt adhesive is melted onto the lines.

DE 27 58 472 discloses a method of producing a flat cable harness, in which the individual wires, which are already provided with an insulation, are arranged between two layers of film, with the film layers being connected to one another through a high-frequency welding method.

DE 37 40 593 C2 describes a method in which the cable harness or a wiring arrangement is integrated into a door frame. The door frame comprises a synthetic resin. The lines constituting the wiring arrangement are either laid in grooves of the synthetic-resin door frame, embedded in the synthetic-resin material through ultrasonic welding or etched onto the surface of the door frame.

SUMMARY OF THE INVENTION

It is the object of the invention to propose an alternative method of producing a cable harness, with which even cable harnesses of a complex nature can be produced, and which is not only suited for a separate cable harness production, but also for the construction of a cable harness directly on a vehicle component. Furthermore, the method is intended to be virtually completely automated.

This object is accomplished by a method in which an essentially strip-shaped base layer, which follows the later course of the cable harness, at least in sections, is applied to the assembly side of an assembly support. The base layer adheres, at least temporarily, to the assembly support. The base layer is preferably automatically put in place with the aid of a robot. The wires are also laid on the base layer by a robot. It is conceivable that a laying head removes the individual wires from a wire magazine and lays them, individually or several at a time, essentially parallel on the base layer. From this point on, the term wires encompasses any type of electrical conductors, such as flat bands, metallically conductive or metallically coated plastics, waveguides, metallic film conductors or the like.

As the third method step, a cover layer comprising a liquid or molten plastic material is sprayed, extruded, poured or brushed onto a wire layer produced, for example, in the described manner, or a granulated or powdered plastic material is applied and subsequently treated in the manner of a sintering process with heat, ultrasound or the like; in the process, the plastic material envelops the wires, adheres to the base layer and hardens, or generally converts to a more solid consistency. Whenever the term liquid plastic material is used in this description, it is also meant to encompass dual-component plastics. An example of such a plastic is polyurethane. The initial mixture of this type of plastic includes two components (olefin and cyanide components) that react with one another as soon as they are mixed together. Assuming the simplest case, in which the base layer and the cover layer comprise the same material, the production of a single- or multi-layer cable harness would merely necessitate a robot-guided application head for the plastic mass and a laying apparatus for the individual wires.

According to another aspect of the invention, the assembly support itself constitutes the vehicle component, for example a vehicle door. In such a case, the base layer remains fixed to the vehicle component. This fixing can be attained solely through the adhesive properties of the cooperating materials. To support the adhesive or material-to-material adherence, the vehicle component can have undercuts, such as interlacings or depressions, which are filled with plastic material when the base layer is applied, thereby assuring an additional mechanical connection or a form fit between the base layer and the vehicle component.

Numerous automobile manufacturers are demanding an increasing level of completion from their suppliers. In view of these demands, suppliers are offering complete assemblies that essentially need only be mounted to the vehicle body in the manufacturing plant. An example of such a component is a vehicle door or a tail gate. With the method according to this aspect, it is conceivable to manufacture the cable harness directly on the component in the supplier's plant.

The assembly support can, however, also be an assembly template, for example in the form of a table, a roller or a production band, with the tabletop, the top of the production band or the circumferential surface of the roller respectively forming the assembly side. In such a procedure, it is advisable for a separating layer to be applied to the assembly support, for example sprayed or brushed on, before the base layer is applied; this separating layer permits the completed cable harness to be released from the assembly support. The respectively used separating means depends on the base layer/assembly support material pairing, and, accordingly, varies from case to case.

The base layer is preferably produced as follows: First, a liquid plastic mass is sprayed, poured, extruded or brushed onto the assembly support; afterward, the plastic mass converts to a more solid consistency, or at least hardens to a certain extent. Furthermore, the base layer can be produced as described above for the cover layer—a granulated or powdered plastic material is applied, and the application of heat, ultrasound or the like subsequently effects a sort of sintering of the plastic particles.

As mentioned above, the same material used for a cover layer can also be used for the base layer, so the above description relating to the material of the cover layer also applies here. For example, a quick-curing plastic can be used, that is, one that reaches its ultimate consistency shortly after being applied. An example of this type of plastic is a polyurea spray elastomer. The material is a relatively thin initial mixture of two components that react with one another (isocyanate and secondary or tertiary amine); they are brought into contact with one another, or are mixed, in a mixer shortly before being applied to the assembly support. A plastic melt or the initial mixture of a dual-component plastic can be used to produce the base layer. An example of this type of plastic is polyurethane. The base layer should typically have a predetermined width. In the case of plastics that do not harden very quickly, an appropriate tool prevents the plastic melt or liquid initial mixture from flowing out. The plastic melt or the initial mixture is, however, preferably thixotropically set, which essentially prevents an applied plastic band from flowing out.

A prefabricated base band embodied in the manner of an adhesive tape or a film blank can also be used as the base layer. A base band of this type can either be affixed mechanically to the assembly support or possibly affixed beneath a separating layer. In an especially preferred embodiment, further wires are laid on the first cover layer and a further cover layer is applied. This cover layer can comprise the same material as the first cover layer. It can, however, consist of a different material, for example if the cover layer also serves as a mechanical protection and, correspondingly, should have a greater mechanical resistance. It is also conceivable that the material of the final cover layer has a greater chemical resistance to the operating materials of a motor vehicle than a lower cover layer or the base layer. The described method can be repeated multiple times for the construction of multi-layer cable harnesses.

The wires can be laid on the base layer or the base band, on the one hand, and on a cover layer, on the other hand, in different ways. In the case of quick-curing plastics, it is advisable to lay the wires with the aid of an adhesive. For this purpose, an adhesive is applied to the corresponding, hardened or solidified layer in accordance with a suitable method, and the wires are laid on this adhesive layer. The wires can also be self-adhesive; for example, they can be sprayed with an adhesive prior to being laid. With an appropriate selection of the plastic, the wires can be fixed to a base or cover layer through high-frequency or ultrasonic welding. With thermoplastic plastics, the respective layer can be warmed, which at least partially sinks the wires into the warmed layer material and embeds them.

The connecting elements that are usually present on a cable harness can be mounted as follows: The electrical connecting elements are preferably fixed, either permanently or detachably, to the assembly support before the base layer or base band is applied. The electrical connecting elements are prepared such that their electrical contact elements, which are preferably embodied as insulation displacement contacts, are freely accessible for producing the electrical-mechanical connection between the wire ends and the contact elements. Connecting elements having a clamshell housing, for example, can be used to assure this accessibility. The one housing half, which supports the electrical contact elements, is fixed in a recess or hole in the assembly support.

Another option is to fix the housing halves to the assembly support with the use of a vacuum. The wires of the first wire layer are laid after the base layer has been applied to the assembly support; the cable ends of the wire ends are preferably pressed into the insulation displacement contacts of the connecting elements automatically, that is, by the laying apparatus itself.

Before the last cover layer is applied, the electrical connecting elements are completed by the positioning of the second housing half. To seal the housing, it can be advisable to envelop the housing, at least in the region of its separation joint, with plastic material, for example when a closing cover layer is applied. The final cover layer is then applied. If it is necessary to provide a longitudinal water seal, the transition region between the electrical connecting element and the cable harness can be enveloped with the material of the closing cover layer. An alternative method is to omit the second housing half and provide a hermetic seal of the connecting elements by introducing the cover-layer material into the half-shell-type housing of the connecting element when the closing cover layer is applied.

BRIEF DESCRIPTION OF THE DRAWINGS

The invention is described in detail below by way of embodiments illustrated in the drawings.

DETAILED DESCRIPTION OF THE PREFERRED EMBODIMENTS

Figure 1:
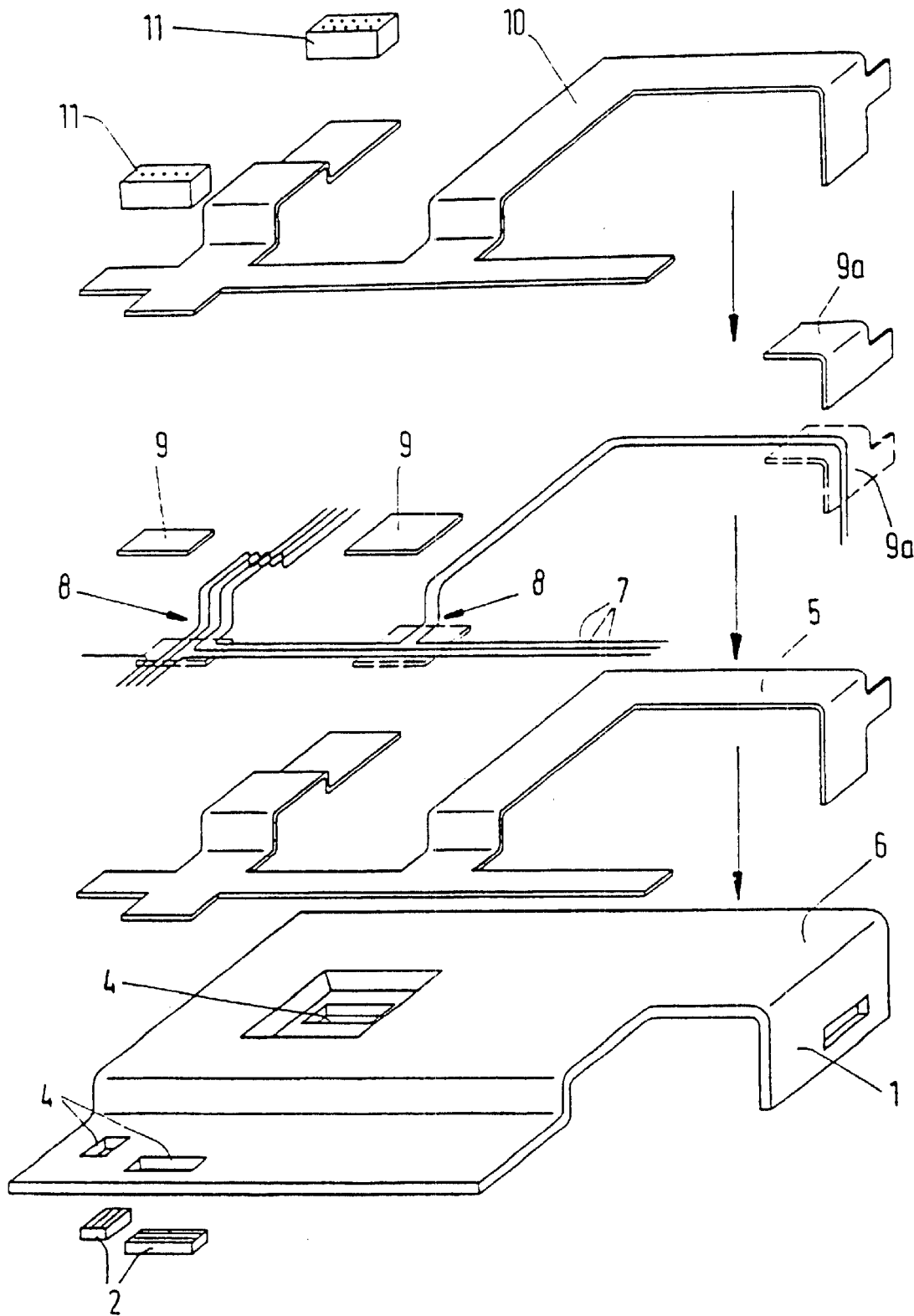
FIG. 1 is a schematic, perspective view that outlines the steps of the method of the invention.

FIG. 1 illustrates a preferred variation of the method of the invention, in which an original part of the motor vehicle, for example a door frame, serves as the assembly support (1). A cable harness is to be laid directly on this door frame. Alternatively, the assembly support can also be an assembly template that includes a full-scale representation of the three-dimensional course of the cable harness on the original component. Hereinafter, however, reference is made to an assembly support that is the vehicle component itself.

Electrical connecting elements 3 of housing shells 2 that are open to the top are first secured to the assembly support 1. For this purpose, holes 4, into which the housing shells 2 are inserted, are provided at predetermined positions. Insulation displacement contacts (not shown) are provided in the housing shells 2. Next, a base layer 5 is applied to the assembly side 6 of the assembly support with the aid of an automatically-controlled application apparatus (not shown).

In FIG. 1, the base layer 5 is shown as being detached from the assembly support 1 for the sake of a clear overview. Numerous different materials are available as the material for the base layer. The material selection reflects, for example, the desired adhesion properties with respect to the material of the assembly support 1, or depends on the type of the intended, later connection between the individual wires of the cable harness and the base layer 5. The base layer can comprise the aforementioned polyurea spray elastomer, an adhesive, for example a thermal adhesive, a thermoplastic plastic, a curable plastic, a light-curing plastic, a plastic that can be sintered, or the like. An adhesive produced by Plasto, F-21304 Chenove Cedex, France, and marketed under the brand name "K1 28" is preferably used as the material for the base layer 5; this adhesive is a mixture of heat-meltable polymers and additives. After being applied, this substance possesses a permanent stickiness, so the wires 7 forming the cable harness adhere securely to a base layer 5 comprising this material. The wires 7 can be insulated or uninsulated. The individual wires can follow, for example, only one primary branch, but can also branch off from it in the manner of a side branch. In the case of branch points in uninsulated wires, it is necessary for at least the branch point 8 to be covered with an insulation layer 9 before further wires that cross the branch points are laid. Points on the cable harness that are heavily mechanically stressed are reinforced by additional cover-layer sections 9a.

As the next step, a cover layer 10 is applied over the wires 7, likewise with the aid of an automatically-controlled application apparatus (not shown). The material of the cover layer is selected such that it connects to the material of the base layer 5. A material that additionally adheres to the wires 7 or their insulation is preferably used. Next, the housing shells 2 of the electrical connecting elements are completed with housing lids 11. The layer thickness of the base layer 5 and the cover layer 10 varies depending on the respective requirements. It is also conceivable for the layers to have a foamy consistency to save weight or influence the mechanical properties of the cable.

The material for the final cover layer is preferably quick-curing, for example the aforementioned polyurea spray elastomer. This type of material seals the cable harness to the outside, and forms an essentially smooth surface that may be printed on or provided with identifying features.

If the predetermined width of a base layer is insufficient for receiving all of the necessary wires of the cable harness, a cable harness according to the invention can be constructed in multiple layers. In this case, further wires are laid on a cover layer, and a cover layer is applied over these wires. The new wires are not laid until the cover layer onto which the wires are to be laid has at least partially hardened or partially solidified. A further wire layer is then laid on the hardened cover layer in the above-described manner.

Figure 2:
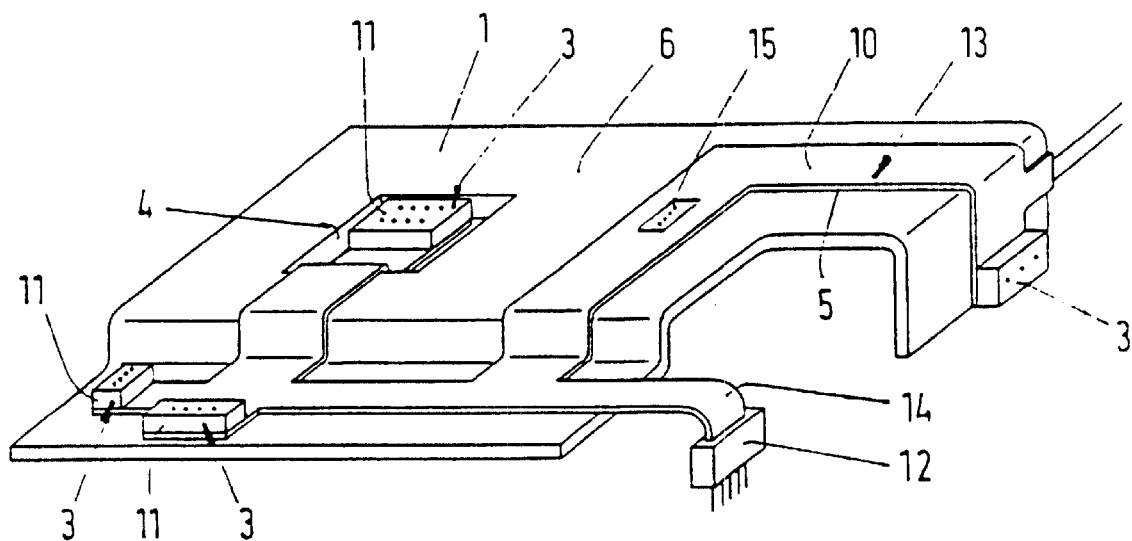
FIG. 2 shows a vehicle component having a cable harness that was produced in accordance with the invention.

FIG. 2 shows the completed assembly support 1 with a cable harness. It is apparent that, in addition to the connecting elements 3, which comprise two housing halves, connecting elements 12, which are disposed on a side branch 14 of the cable harness 13 that is not supported by the assembly support 1, can be present on the cable harness. A connecting element 12 such as this is advisably mounted after the cable harness is complete. It can also be seen that built-in components such as a diagnosis connector 15 or an electronic component can be integrated into a cable harness of the invention.

Figure 4:
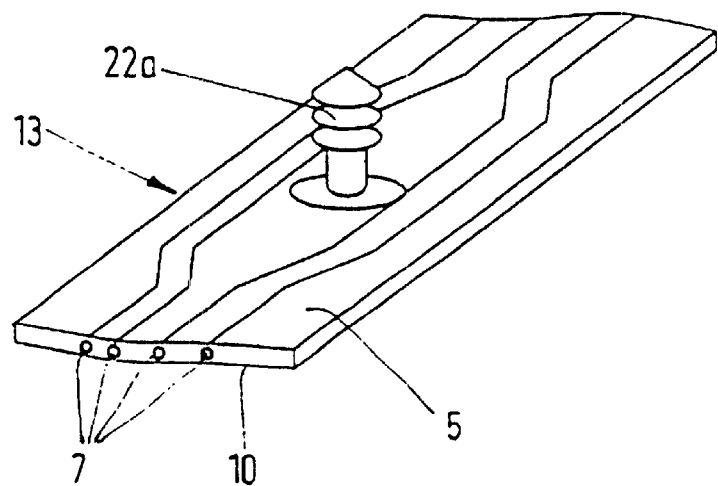
FIG. 4 is a cutout of a cable harness having a formed-on fixing element.
Figure 3:
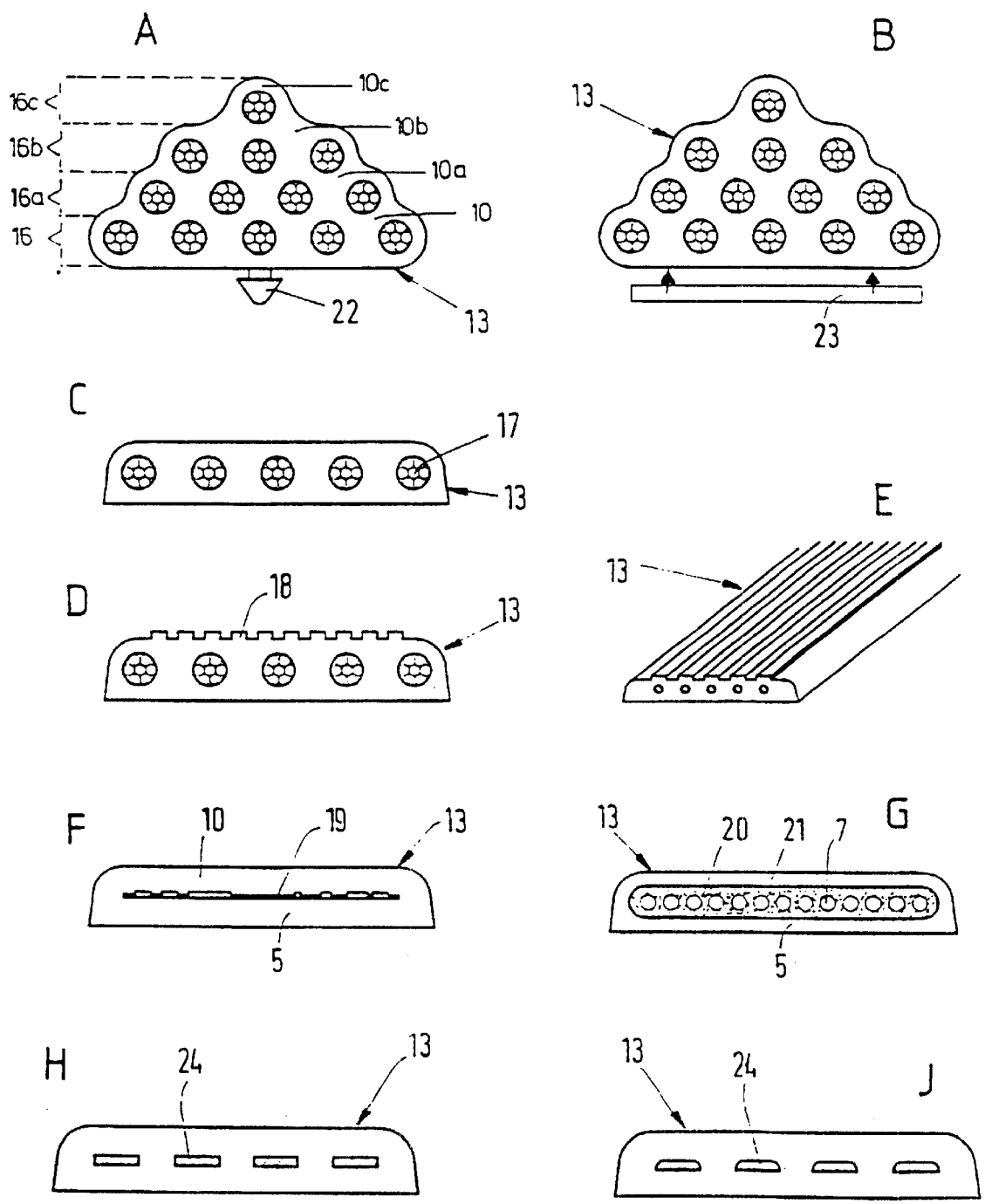
FIGS. 3A–J are sectional representations of different construction variations of cable harnesses that were produced in accordance with the invention.

FIGS. 3A–3G show different cross-section shapes of a cable harness of the invention. For the sake of simplification, the drawing shows wires having identical cross sections. Wires having different thicknesses and cross-section shapes can be present inside a cable harness, however. FIGS. 3A and 3B show a multi-layer cable harness that has an approximately triangular cross section. This triangular shape results from the reduction in the widths of successive partial layers 16, 16a, 16b, 16c respectively encompassing a wire layer and a cover layer. This is a requirement for cover layers that are to be produced through the application of a more or less fluid material. A mushroom-shaped fixing element 22 is formed onto the underside of the cable harness according to FIG. 3A. A similar fixing element 22a is also present in the cable-harness cutout of FIG. 4. These fixing elements 22, 22a can be produced in that a molded hollow that corresponds to the mushroom-shaped fixing element is provided in the assembly support; the material of the base layer penetrates this hollow when it is applied. Another option is to dispose a prefabricated fixing element in a receiving opening in the assembly support such that it projects out of the assembly support with a fixing end and, when the base layer is applied, is formed onto it.

A cable harness produced in the above-described manner can be fixed to a vehicle component in that a double-sided adhesive film 23 is fixed to the outside, preferably in the region of the base layer, as shown in FIG. 3B. FIG. 3C shows a single-layer flat cable harness having a total of five wires or lines 17. The surface of the cable harness shown in FIGS. 3D and 3E has ribs 18, which extend parallel to one another in the longitudinal direction and can serve, for example, to reinforce the cable harness and protect against wear. In the cable harness according to FIG. 3F, a set of film lines 19 is laid on the base layer 5 instead of a plurality of individual wires. In the cable harness according to FIG. 3G, the wires 7 are embedded in a core 20 comprising a foam material. The foam core can be produced as follows: First, a cover layer of a foam material is applied to the base layer 5, and the wires 7 are in turn laid on the foam layer. If need be, a further foam layer that covers the wires 7 can be applied. Finally, after the foam layer has hardened, a final layer 21 that envelops the core 20 is applied. In the cable harnesses shown in FIGS. 3H and 3I, metal films 24 are used as wires or conductors. In 3H, the metal films have a rectangular cross section. In the cable harness according to FIG. 3J, the metal films likewise have an essentially rectangular cross-section profile, but their edges are slightly rounded.

Figure 5:
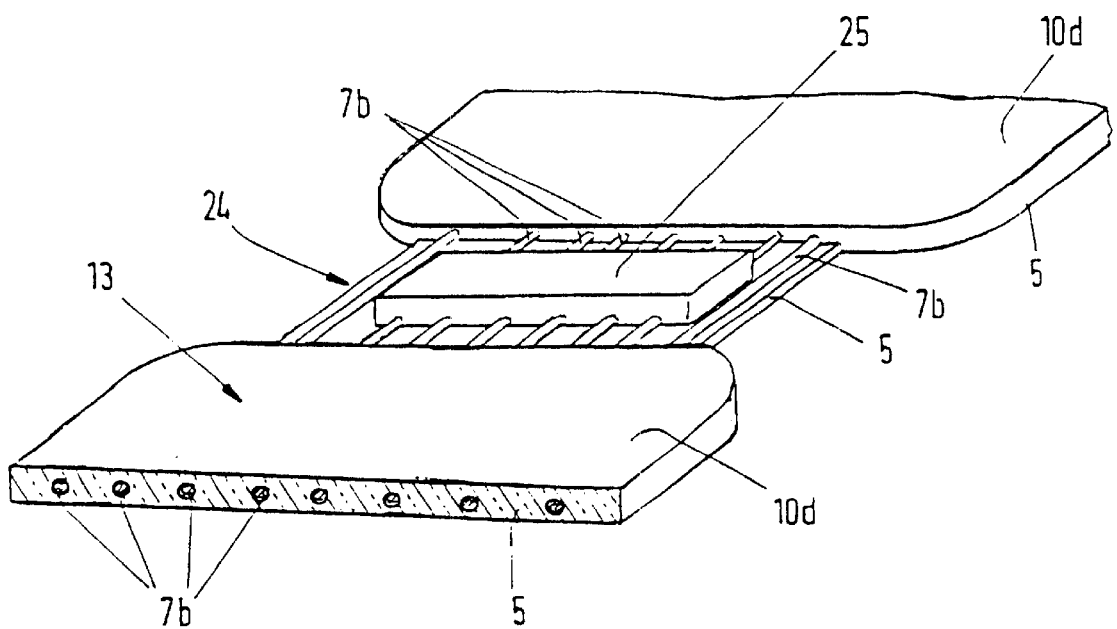
FIG. 5 is a cutout, in perspective, of a flat cable harness having an integrated electronic component.
Figure 6:
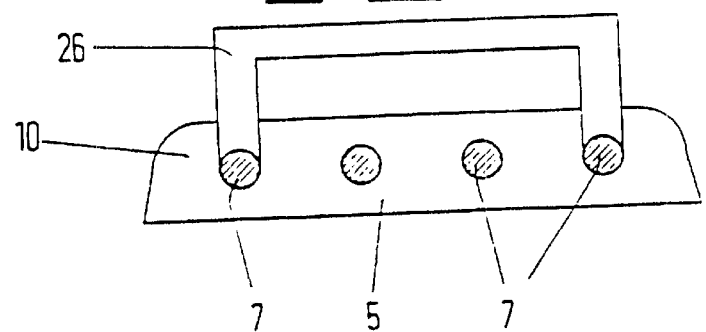
FIG. 6 is a cross-sectional representation of a cable harness, in which a bridge connects two wires.

It is often necessary to integrate an electrical or electronic component into the cable harness, as shown in FIG. 5, for example. Here, a cover layer 10d is provided with a gap or an insulation window 24, which exposes the wires 7b that are covered by the cover layer 10d in front of and behind the window. The wires 7b can be separated in the region of the insulation window 24, and an electronic component 25, for example, can be interposed. The insulation window is covered or sealed with a cover-layer section (not shown) after the component 25 has been inserted. This can be effected over the course of the layer construction of a multi-layer cable harness. For adaptation to a relatively small component having a narrow connector grid pitch, it can be advisable to lay the wires with narrow spacing from one another in the region of the insulation window 24. The base layer 5 and, accordingly, the cover layers located above it, can be laterally narrowed, that is, they can have a smaller width than the remainder of the cable harness. In addition to the aforementioned electronic components, bridges 26 can also be produced in the described manner between the wires 7 of a cable harness, as shown in FIG. 6, for example.

What is claimed is:

1. A method of producing a cable harness, capable of placement on a shape assembly support having an assembly side for receiving the cable harness, comprising the steps of:

a) applying an essentially strip-shaped base layer comprising a plastic thixotropic material, which said strip-shaped base layer follows a shape of the cable harness on the assembly side of the assembly support so that the base layer at least temporarily adheres to the assembly side;

b) treating the base layer subsequent to step a) so that the plastic thixotropic material changes to a more solid consistency;

c) fixing to the base layer individual wires to form a plurality of essentially parallel, adjacent wires so that the individual wires adhere securely to the base layer of step b);

d) applying a cover layer made of a plastic material onto the base layer; and e) treating the cover layer subsequent to step d) so that the cover layer envelops the individual wires, adheres and connects to the base layer and forms a uniform protective cover for the individual wires, wherein steps b), c), d) and e) are sequentially repeated until at least one layer of additional individual wires and additional plastic cover layers is achieved.

2. The method according to claim 1, wherein the assembly support comprises a vehicle component, and the base layer remains fixed thereto.

3. The method according to claim 1, wherein the assembly support is a table, a roller or a production band and the assembly side, depending on an assembly support shape, is a table top, a projection band top or a roller circumferential surface.

4. The method according to claim 3 further comprising prior to step (a), spraying or brushing a component on the assembly side of the assembly support, which the component permits release of the cable harness after step (e).

5. The method according to claim 1, wherein the plastic material of the covering layer is polyurea spray elastomer.

6. The method according to claim 1, wherein the base layer comprises a plastic melt or an initial mixture of a dual-component plastic.

7. The method according to claim 6, wherein the plastic melt or the initial mixture is thixotropically set.

8. The method according to claim 1 wherein the additional wires and the additional cover layers are assembled to form a multi-layer cable harness.

9. The method according to claim 1, wherein the individual wires are laid on the base layer or a cover layer using an adhesive.

10. The method according to claim 1, wherein the plastic material of the covering layer or the base layer is a thermoplastic plastic material, and the method further comprises applying heat to soften the thermoplastic plastic material and sinking the individual or additional individual wires into softened thermoplastic material.

11. The method according to claim 1, wherein step (c) comprises laying the wires before the plastic thixotropic material has hardened.

12. The method according to claim 1, further comprising fixing electrical connecting elements to the assembly support so that the electrical connecting elements are freely accessible for electrical-mechanical connection.

13. The method according to claim 12, further comprising closing the electrical connecting elements with a housing lid after step e).

14. The method according to claim 12, further comprising at least partially filling, casting or spraying the electrical connecting elements with the plastic material that forms the cover layer.

15. The method according to claim 1, wherein the cover layer is applied to form an insulation window, and wherein the individual or additional individual wires are freely accessible in said window for connection of an electronic component or a bridge.

* * * * *